United States Patent
Li et al.

(10) Patent No.: US 10,580,908 B2
(45) Date of Patent: Mar. 3, 2020

(54) VARIABLE THICKNESS GATE OXIDE TRANSCAP

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/947,667

(22) Filed: Apr. 6, 2018

(65) Prior Publication Data

US 2019/0312153 A1 Oct. 10, 2019

(51) Int. Cl.
| | |
|---|---|
| *H01L 29/93* | (2006.01) |
| *H01L 27/08* | (2006.01) |
| *H01L 29/06* | (2006.01) |
| *H01G 7/06* | (2006.01) |
| *H01L 29/739* | (2006.01) |
| *H01L 29/94* | (2006.01) |

(52) U.S. Cl.
CPC ............... *H01L 29/93* (2013.01); *H01G 7/06* (2013.01); *H01L 27/0808* (2013.01); *H01L 29/0615* (2013.01); *H01L 29/0646* (2013.01); *H01L 29/7392* (2013.01); *H01L 29/945* (2013.01)

(58) Field of Classification Search
CPC .................................. H01L 29/93; H01G 7/06
USPC ......................................................... 257/596
See application file for complete search history.

(56) References Cited

U.S. PATENT DOCUMENTS

| | | | |
|---|---|---|---|
| 9,401,436 B2 * | 7/2016 | Marino | H01L 29/94 |
| 9,882,066 B1 * | 1/2018 | Marino | H01L 29/93 |
| 10,115,835 B2 * | 10/2018 | Carobolante | H01L 24/08 |
| 10,283,650 B2 * | 5/2019 | Li | H01L 29/66189 |
| 10,319,866 B2 * | 6/2019 | Marino | H01L 29/93 |
| 2011/0149464 A1 * | 6/2011 | Takahashi | H01G 7/06 361/277 |

* cited by examiner

Primary Examiner — Jami Valentine Miller
(74) Attorney, Agent, or Firm — Patterson & Sheridan, L.L.P.

(57) ABSTRACT

Aspects of the present disclosure provide semiconductor variable capacitor devices. In one embodiment, a semiconductor variable capacitor includes a gate oxide layer comprising a first layer portion with a first thickness and a second layer portion with a second thickness; a first non-insulative region disposed above the gate oxide layer; a first semiconductor region disposed beneath the gate oxide layer; a second semiconductor region disposed beneath the gate oxide layer and adjacent to the first semiconductor region, wherein the second semiconductor region comprises a different doping type than the first semiconductor region a second non-insulative region coupled to the first semiconductor region; and a control terminal coupled to a control region coupled to the second semiconductor region such that a first capacitance between the first non-insulative region and the second non-insulative region is configured to be adjusted by varying a control voltage applied to the control region.

19 Claims, 11 Drawing Sheets

VARIABLE THICKNESS GATE OXIDE TRANSCAP

INTRODUCTION

Aspects of the present disclosure relate to electronic circuits and, more particularly, to variable semiconductor capacitors.

A variable capacitor is a capacitor whose capacitance may be altered, for example, due to a control voltage. Also referred to as a varactor, a variable capacitor may be used in any of various applications where there is a desire to adjust a capacitance, such as in inductor-capacitor (LC) circuits to set the resonance frequency of an oscillator (e.g., radio frequency channel tuning) or as a variable reactance (e.g., for impedance matching in antenna tuners).

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

More recently, variable semiconductor capacitor devices have been developed. These devices may also be referred to as transcap (TC) devices. The structure of these devices provides a variable semiconductor capacitor with a metal-oxide semiconductor (MOS)-compatible structure suitable for integrated circuits, which has at least three terminals, one of which is used to modulate the capacitance value between the other two terminals of the device, by increasing or decreasing its DC voltage with respect to one of the main terminals of the device.

BRIEF SUMMARY

Certain embodiments provide a semiconductor variable capacitor including: a gate oxide layer comprising a first layer portion with a first thickness and a second layer portion with a second thickness; a first non-insulative region disposed above the gate oxide layer; a first semiconductor region disposed beneath the gate oxide layer; a second semiconductor region disposed beneath the gate oxide layer and adjacent to the first semiconductor region, wherein the second semiconductor region comprises a different doping type than the first semiconductor region; a second non-insulative region coupled to the first semiconductor region; and a control region coupled to the second semiconductor region such that a first capacitance between the first non-insulative region and the second non-insulative region is configured to be adjusted by varying a control voltage applied to the control region.

Certain embodiments provide a method that includes forming a gate oxide layer comprising a first layer portion with a first thickness and a second layer portion with a second thickness; forming a first non-insulative region disposed above the gate oxide layer; forming a first semiconductor region disposed beneath the gate oxide layer; forming a second semiconductor region disposed beneath the gate oxide layer and adjacent to the first semiconductor region, wherein the second semiconductor region comprises a different doping type than the first semiconductor region; forming a second non-insulative region coupled to the first semiconductor region; and forming a control region coupled to the second semiconductor region such that a first capacitance between the first non-insulative region and the second non-insulative region is configured to be adjusted by varying a control voltage applied to the control region.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide semiconductor variable capacitor devices, also referred to as transcap (TC) devices, suitable for integrated circuits.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

A TC device may have at least three terminals, where the capacitance between two main terminals of the device (C1 and C2) can be varied by changing a voltage applied between a control terminal (CTRL) and one of the other two main terminals (e.g., C2). Certain aspects of the present disclosure provide various semiconductor variable capacitors having gate oxide layers with variable thickness, such as two discrete thicknesses.

Figure 1:
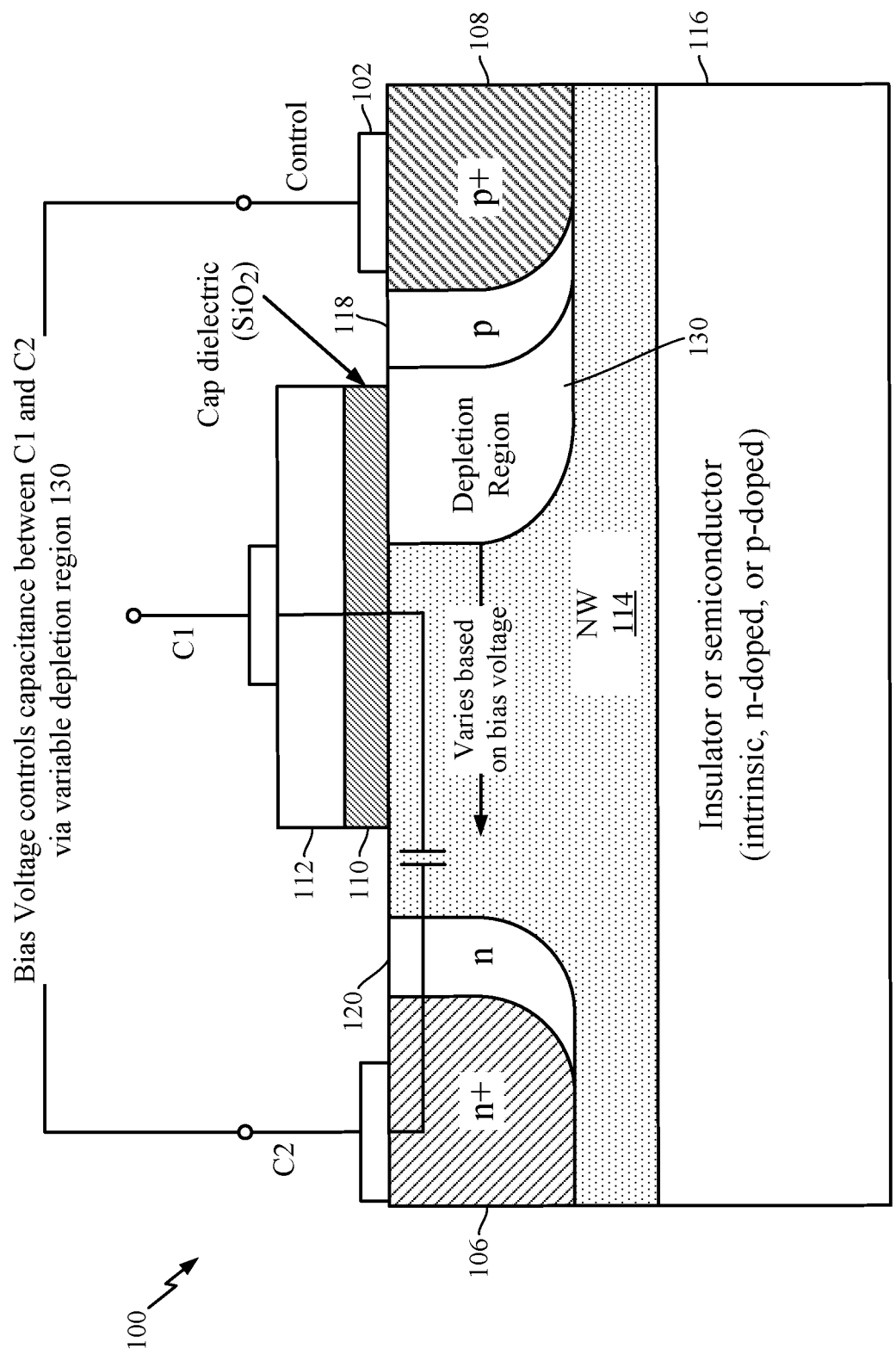
FIG. 1 depicts a cross-sectional view of an example variable semiconductor capacitor.

FIG. 1 depicts a cross-sectional view of an example structure of a transcap (TC) device 100. Certain implementations of a TC device use an oxide layer 110, which may be similar to oxide gate layers used to fabricate metal-oxide semiconductor (MOS) devices (e.g., thin or thick gate oxide). The oxide layer 110 isolates the C1 and C2 terminals and thus in effect acts as a dielectric for TC device 100. A non-insulative region 106 (e.g., an n+ implantation region) and a non-insulative region 108 (e.g., a p+ implantation region) may be formed on the two sides of the TC device 100 in order to create p-n junctions. As used herein, a non-insulative region generally refers to a region that may be electrically conductive or semiconductive.

In one example, a bias voltage may be applied between the control terminal 102 and the C2 terminal in order to modulate the capacitance between terminals C1 and C2 (across the oxide layer 110). For example, by applying a bias voltage to the control terminal 102, a depletion region 130 may be formed at the p-n junction between the non-insulative region 108 (e.g., control region) and a semiconductor region, which may implemented using an n-well (NW) region 114. Based on the bias voltage, this depletion region 130 may widen under the oxide layer 110 and reduce the area of the equivalent electrode formed by the NW region 114, and thereby also reduce the effective capacitance area and capacitance value of TC device 100.

The work-function of a non-insulative region 112 above the oxide layer 110 may be chosen to improve the device performance. For example, an n-doped poly-silicon material may be used (instead of p-doped), even if the NW region 114 underneath the oxide layer 110 is doped with n-type impurities. In some aspects, a metallic material (also doped if desired) with an opportune work-function or a multi-layer stack of different metallic materials may be used for the non-insulative region 112, so as to obtain the desired work-function. In certain aspects, the non-insulative region 112 may be divided into two sub-regions (e.g., one n-doped and one p-doped), or a different metallic material may be used for each sub-region.

In some cases, NW region 114 may be disposed above a non-conductive region 116 (e.g., an insulator or semiconductor). As used herein, a non-conductive region generally refers to a region that may be electrically insulative or semiconductive. The type of material for non-conductive region 116 may be chosen in order to improve the performance of TC device 100. For example, non-conductive region 116 may be an insulator, a semi-insulator, or an intrinsic/near-intrinsic semiconductor in order to decrease the parasitic capacitances associated with a substrate (not shown). In some cases, non-conductive region 116 can be made of n-doped or p-doped semiconductor with an appropriate doping profile in order to increase the TC device quality factor and/or the control of the depletion region 130 formed between the non-insulative region 108 and the NW region 114 when applying a bias voltage to the control terminal 102. Non-conductive region 116 can also be formed by multiple semiconductor layers or regions doped in different ways (n, p, or intrinsic). Furthermore, the non-conductive region 116 can include semiconductors, insulating layers, and/or substrates or can be formed above semiconductors, insulating layers, and/or substrates.

The width of depletion region 130 in NW region 114 may be controlled by applying a control voltage to the control terminal 102. The capacitance between the C1 and C2 terminals may depend on the dimensions of the depletion region 130 in NW region 114, and thus, can be controlled by applying the control voltage to control terminal 102. Furthermore, the variation of the bias voltage applied to control terminal 102 may not alter the DC voltage between the C1 and C2 terminals, allowing for improved control of the device characteristics. If a voltage applied to the C1 terminal is half of a voltage applied to the C2 terminal, the voltage difference between the C2 and C1 terminals (or between the C1 terminal and the control terminal 102) may be reduced. The higher voltage of the C2 terminal (e.g., about twice the breakdown voltage of the C1 terminal to the control terminal) allows for an increase in the capacitance range for the TC device 100.

In some cases, it may be preferable to locate the non-insulative region 106 and/or the non-insulative region 108 away from the oxide layer 110 in order to reduce the parasitic capacitance associated with the non-insulative region 108 and increase the isolation of the non-insulative region 106 for high control voltages. For example, the non-insulative region 106 can be partially overlapped by the oxide layer 110, or the non-insulative region 106 can be formed at a distance from the edge of the oxide layer 110 so as to increase the device tuning range and linearity. In the latter case, the voltage-withstanding capability of the device is increased since a portion of a signal (e.g., a radio frequency (RF) signal) applied to the C1 and C2 terminals drops between the oxide edge and the non-insulative region 106 instead of being applied entirely across the oxide layer 110.

The non-insulative region 108 can be partially overlapped by the oxide layer 110, or the non-insulative region 108 can be spaced apart therefrom so as to reduce the parasitic capacitance between the C1 terminal and the control terminal 102.

A p-doped region 118 can be optionally used to increase the breakdown voltage of the p-n junction between the non-insulative region 108 and the NW region 114, at the same time decreasing the parasitic capacitance between the C1 terminal and the control terminal 102. Similarly, an optional n-doped region 120 can be added between the non-insulative region 106 and the NW region 114 in order to regulate the doping concentration between the oxide layer 110 and the non-insulative region 106.

Figure 2:
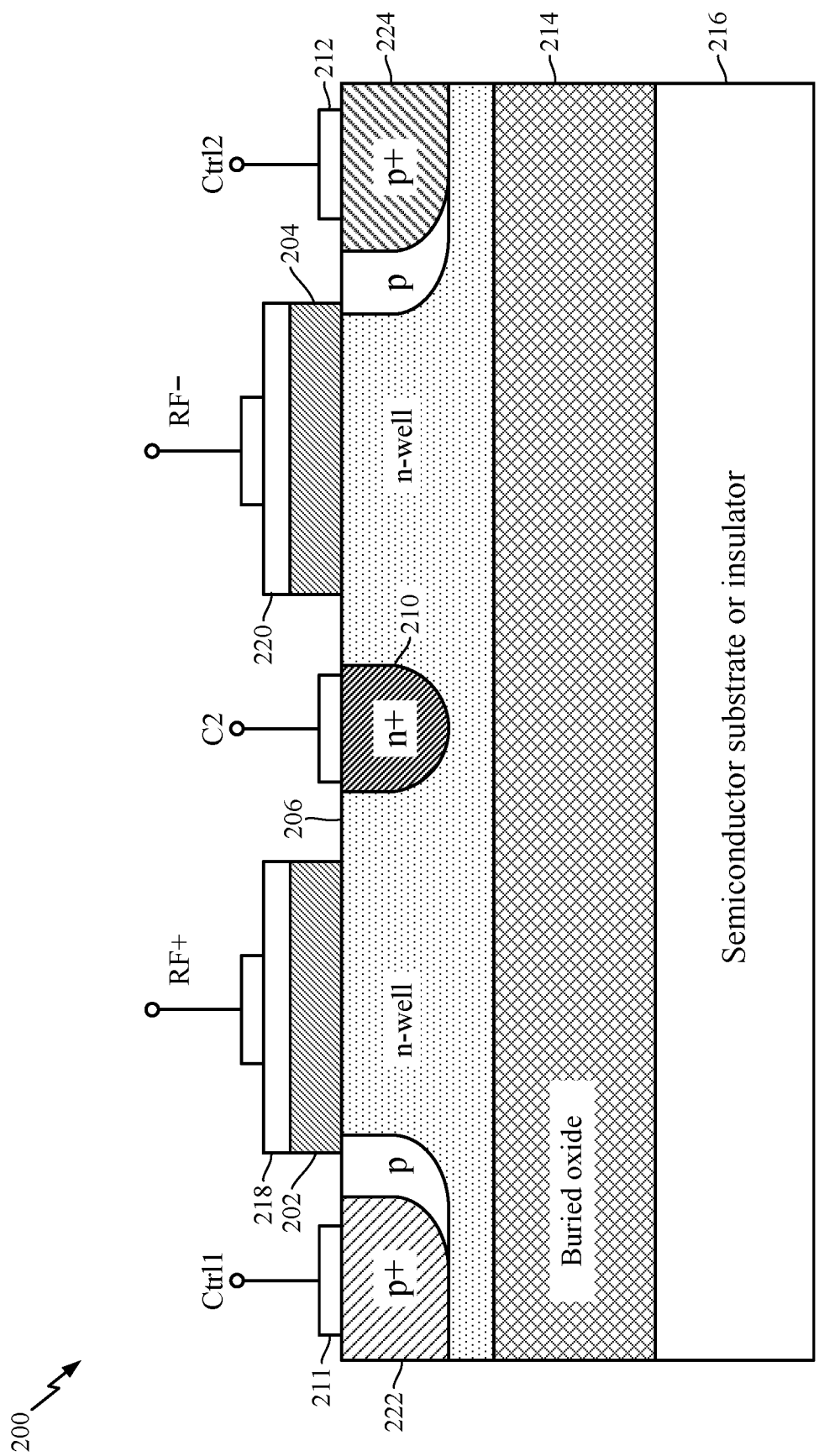
FIG. 2 depicts a cross-sectional view of example differential variable semiconductor capacitors.

FIG. 2 depicts an example differential TC device 200 in cross-section. The differential TC device 200 can be obtained by disposing two of the TC devices 100 back-to-back. In this example, RF+ and RF− terminals (e.g., corresponding to the C1 terminal in FIG. 1) correspond to the positive and negative nodes of a differential RF port for a differential RF signal. The RF+ terminal may be disposed on an oxide layer 202, and the RF− terminal may be disposed on an oxide layer 204 (both layers 202, 204 analogous to the oxide layer 110 in FIG. 1). A shared n-well region 206 (analogous to NW region 114) may be coupled to a C2 terminal via a non-insulative region 210 (e.g., with n+ doping), as illustrated. A bias voltage may be applied to the control terminals 211 (Cntrl1) and 212 (Cntrl2) (or to the C2 terminal with respect to the other terminals of the device) to adjust depletion regions of the n-well region 206, thereby adjusting the capacitance between respective RF+ and RF− terminals and the C2 terminal. In some aspects, as illustrated in FIG. 2, a buried oxide layer 214 may be positioned below n-well region 206 and above a non-conductive region 216 (analogous to non-conductive region 116 in FIG. 1). In some examples, the buried oxide layer 214 may be composed of a semiconductor substrate or insulator.

Example Variable-Thickness Gate Oxide Layer Transcap (TC) Devices

Figure 3A:
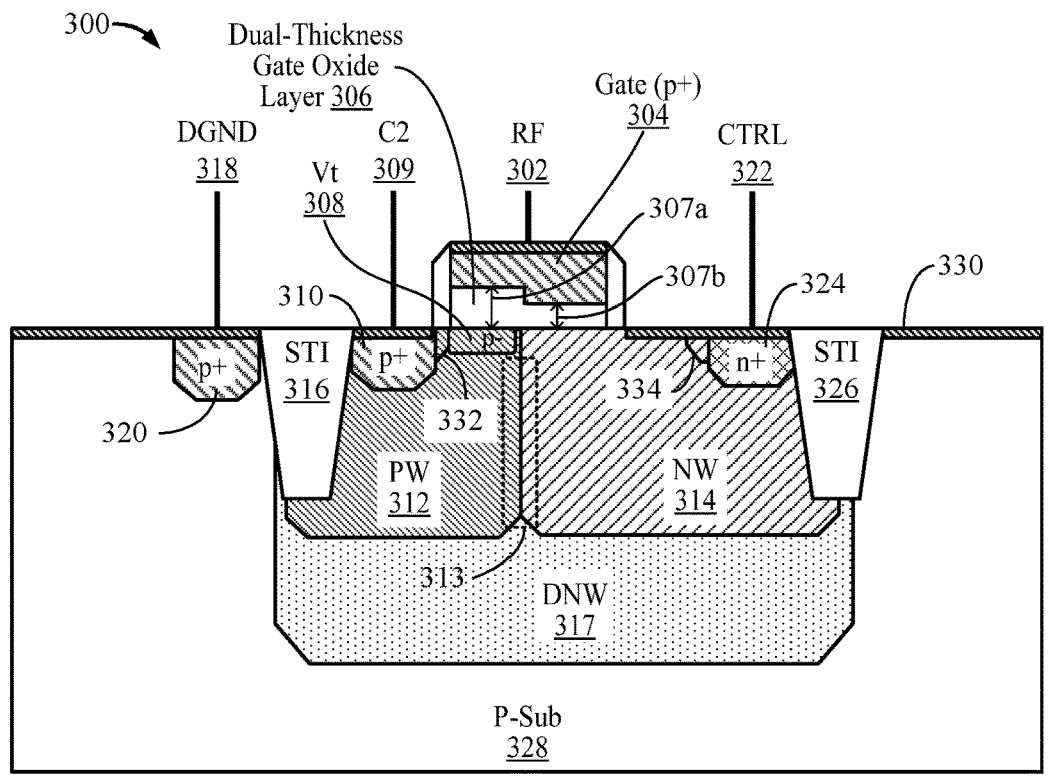
FIG. 3A depicts a cross-sectional view of an example p-gate transcap (TC) device with a variable thickness gate oxide layer in a first orientation.

FIG. 3A depicts a cross-sectional view of an example p-gate transcap (TC) device 300 with a variable thickness gate oxide layer 306. In this example, the variable thickness gate oxide layer 306 is a dual-thickness gate oxide layer (i.e., having two distinct thicknesses 307a and 307b). In other examples, the variable thickness gate oxide layer 306 may include more than two distinct thicknesses.

The thinner portion of gate oxide layer 306 with thickness 307b may be referred to as the core gate oxide portion of gate oxide layer 306. The thicker portion of gate oxide layer with thickness 307a may be referred to as the IO gate oxide. In some embodiments, the ratio of the thicknesses (e.g., 307a/307b) may be dependent on the technology and may be, for example, approximately ~2/1, ~5/2, ~5/3, ~5/4, ~10/7, or others. The ratio of the first thickness 307a to the second thickness 307b may be configured to adjust the tuning performance of TC device 300. Notably, the two distinct thicknesses in this example are not the result of natural process variation, but rather the result of intentional design and fabrication steps.

The location of the transition between first thickness 307a and second thickness 307b in FIG. 3A is exemplary, and may be different in other examples. Further, in this example, the thin portion 307b of dual-thickness gate oxide layer 306 is on the control signal side (i.e., on the same side as control signal terminal 322). In some examples, the variable-thickness gate oxide layer 306 may formed in silicon on insulator (SOI) fabrication processes (e.g., CMOS fully depleted (FDSOI) or partial depletion SOI processes).

A non-insulative region 304 (e.g., a gate, analogous to the non-insulative region 112 of FIG. 1) may be disposed above the dual-thickness gate oxide layer 306. Note that as compared to oxide layer 110 of FIG. 1, dual-thickness gate oxide layer 306 includes two distinct thicknesses, 307a and 307b. Although non-insulative region 304 is doped p+ in FIG. 3A, non-insulative region 304 may be alternatively doped, with, for example, p-type metal, n+ doping, n-type metal, and others in alternative embodiments. Using p+ or n+ doping or p-type metal or n-type metal for the non-insulative region 304 in p-type or n-type channel TC devices may beneficially reduce gate depletion. Non-insulative region 304 is coupled to a signal terminal 302 labeled "RF," in FIG. 3A.

In FIG. 3A, a non-insulative region 310 is disposed within and thus electrically coupled to a p-well (PW) 312. In this example, non-insulative region 310 is doped p+, and PW 312 is doped p− to connect each other. Although non-insulative region 310 is doped p+ in this example, non-insulative region 310 may be alternatively doped (e.g., n+) in other examples. Non-insulative region 310 is coupled to a signal terminal 309 labeled "C2".

A non-insulative control region 324 is disposed within and thus electrically coupled to n-well (NW) 314. In this example, non-insulative control region 324 is doped n+, and NW 314 is doped n− to connect each other. Although non-insulative control region 324 is doped n+ in FIG. 3A, non-insulative control region 324 may be alternatively doped (e.g., p+) in other examples. Control region 324 is coupled to a control terminal 322 labeled "CTRL". In examples such as that of FIG. 3A, the non-insulative control region 324 has a different doping type than non-insulative region 310.

Collectively, PW 312 and NW 314 will create a large depletion region under gate oxide layer 306.

In this example, TC device 300 includes a threshold voltage (Vt) implant region 308 interposed between non-insulative region 304 (and more specifically, dual-thickness gate oxide layer 306) and p-well (PW) 312. Vt implant region 308 may improve the quality factor (Q) of the capacitor formed between non-insulative region 304 and non-insulative region 310. Vt implant region 308 may also decrease resistance in the pathway between RF signal terminal 302 and C2 signal terminal 309. Although Vt implant region 308 is doped p− in FIG. 3A, Vt implant region 308 may be alternatively doped (e.g., n−) in other examples. In some examples, Vt implant region 308 may have the same doping type as non-insulative region 310 (e.g., both p-doped as illustrated in FIG. 3A). In other examples, Vt implant region 308 may be doped with any of various suitable dopants or implants (e.g., B or BF2).

In FIG. 3A, a semiconductor region 317 (here, a deep n-well (DNW) region) is disposed beneath semiconductor regions 312 and 314 for noise isolation (e.g., isolating substrate 328 from noise from RF signal terminal 302).

A substrate layer 328 (e.g., a p-type substrate labeled "P-sub") may be disposed below the semiconductor region (DNW) 317. In some examples, the substrate layer 328 may have a different doping type than the semiconductor (DNW) region 317. In this example, substrate layer 328 is coupled to a reference potential terminal (e.g., digital ground, labeled "DGND") via a non-insulative region 320.

In some examples, a first shallow trench isolation (STI) region 316 may be disposed between substrate layer 328 and semiconductor region (PW) 312. In some examples, STI region 316 may also be disposed above at least a portion of semiconductor region (PW) 312.

In some examples, a second STI region 326 may be disposed between substrate layer 328 and semiconductor region (NW) 314. In some example, STI region 326 may also be disposed above at least a portion of semiconductor region (NW) 314.

TC device 300 also includes lightly doped diffusion (LDD) regions 332 and 334. For example, p-type LDD region 332 reduce series resistance between p+ non-insulative region 310 and p− Vt implant 308, which in-turn increases the quality factor (Q) of the capacitor formed between non-insulative region 304 and non-insulative region 310. TC device 300 also includes a silicide layer 330, which may beneficially reduce series resistance.

In operation, a control voltage applied between CTRL terminal 322 and C2 terminal 309 may be used to adjust the capacitance between the non-insulative region 304 and the non-insulative region 310, across the dual-thickness gate oxide layer 306. For example, varying the control voltage applied to CTRL terminal 322 varies the relative location (e.g., left and right) and size (e.g., width) of a depletion region 313 formed at the p-n junction between PW 312 and NW 314. As depletion region 313 widens, the capacitance value of TC device 300 is reduced due to the reduced area of the equivalent electrode formed by PW 312 and Vt 308. Further, as depletion region 313 moves, for example, left, relatively less of the thicker portion 307a of dual thickness gate oxide layer 306 is engaged, which allows a further level of tuning of TC device 300. For example, if more of the thicker portion 307a is engaged, the capacitance will be smaller, while if more of the thinner portion 307b is engaged, then the capacitance will be larger.

Figure 3B:
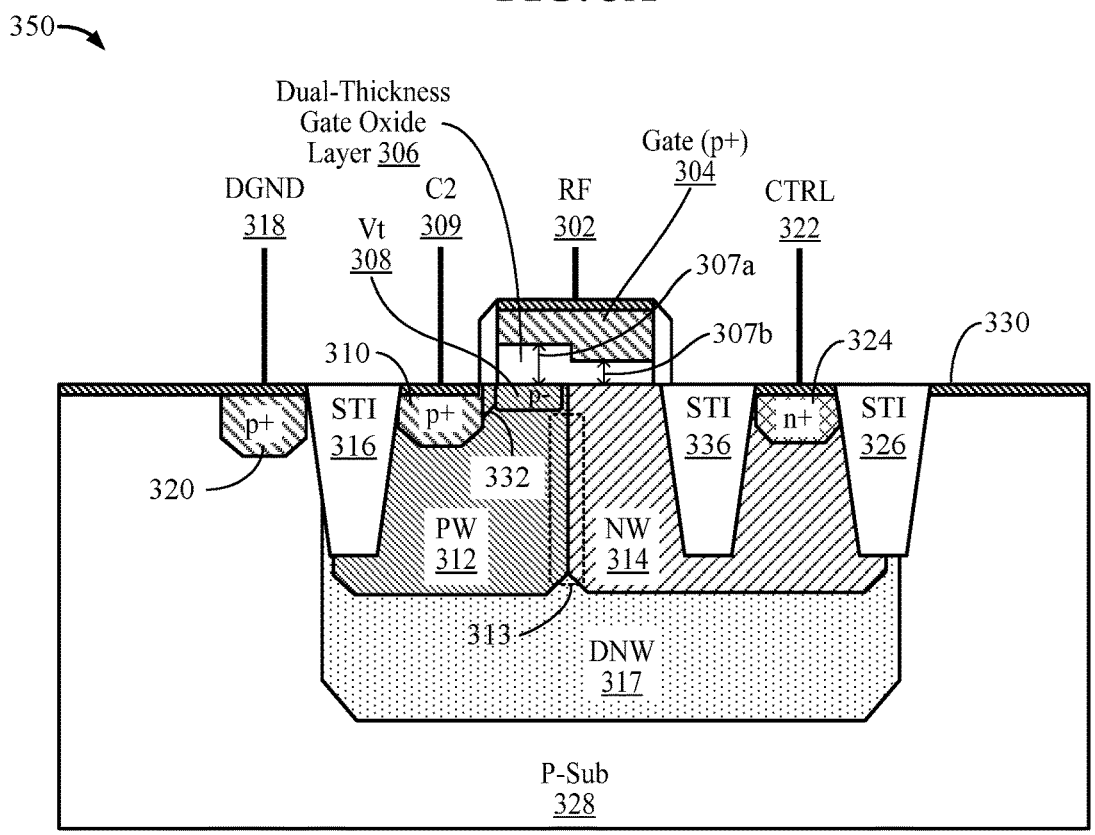
FIG. 3B depicts a cross-sectional view of an example p-gate transcap device with a variable thickness gate oxide layer in a first orientation and an additional STI region.

FIG. 3B depicts a p-gate transcap device 350 similar to transcap device 300 in FIG. 3A, but with an additional STI region 336. STI region 336 allows a higher reverse bias voltage to be applied to control terminal 322 without breakdown.

Figure 4A:
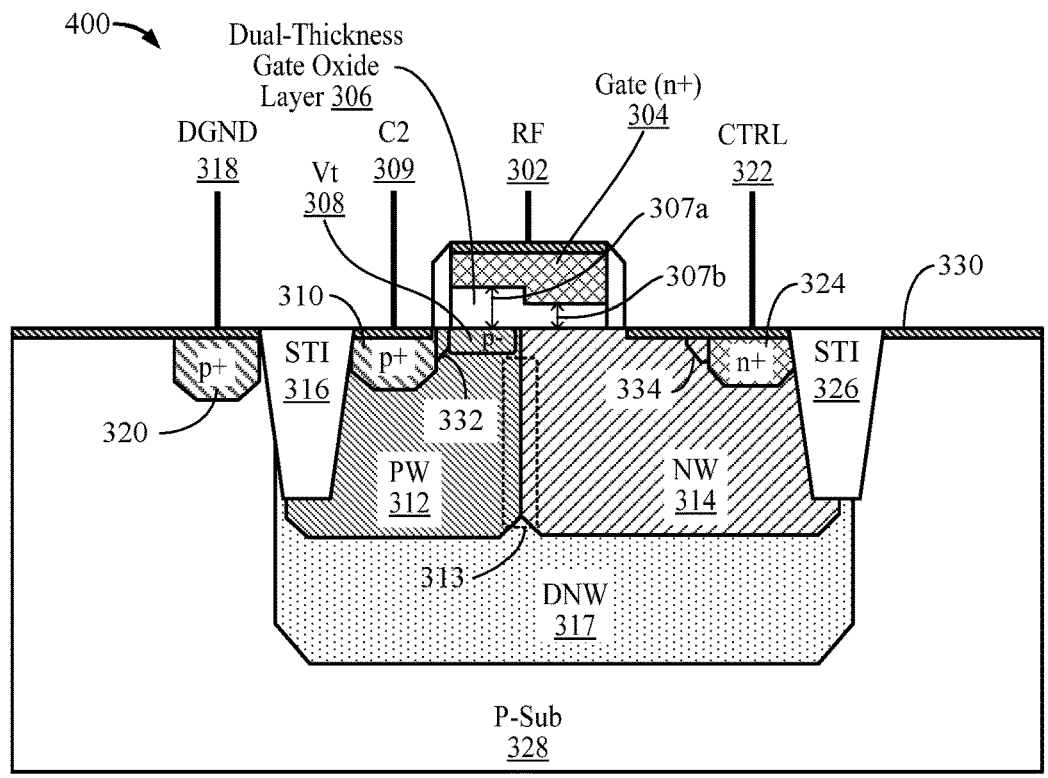
FIG. 4A depicts a cross-sectional view of an example n-gate transcap device with a variable thickness gate oxide layer in a first orientation.

FIG. 4A depicts an n-gate transcap device 400 similar to transcap device 300 in FIG. 3A, but in this example the non-insulative region 304 is n+ doped. In another embodiment, non-insulative region 304 may be an n-type metal gate.

Figure 4B:
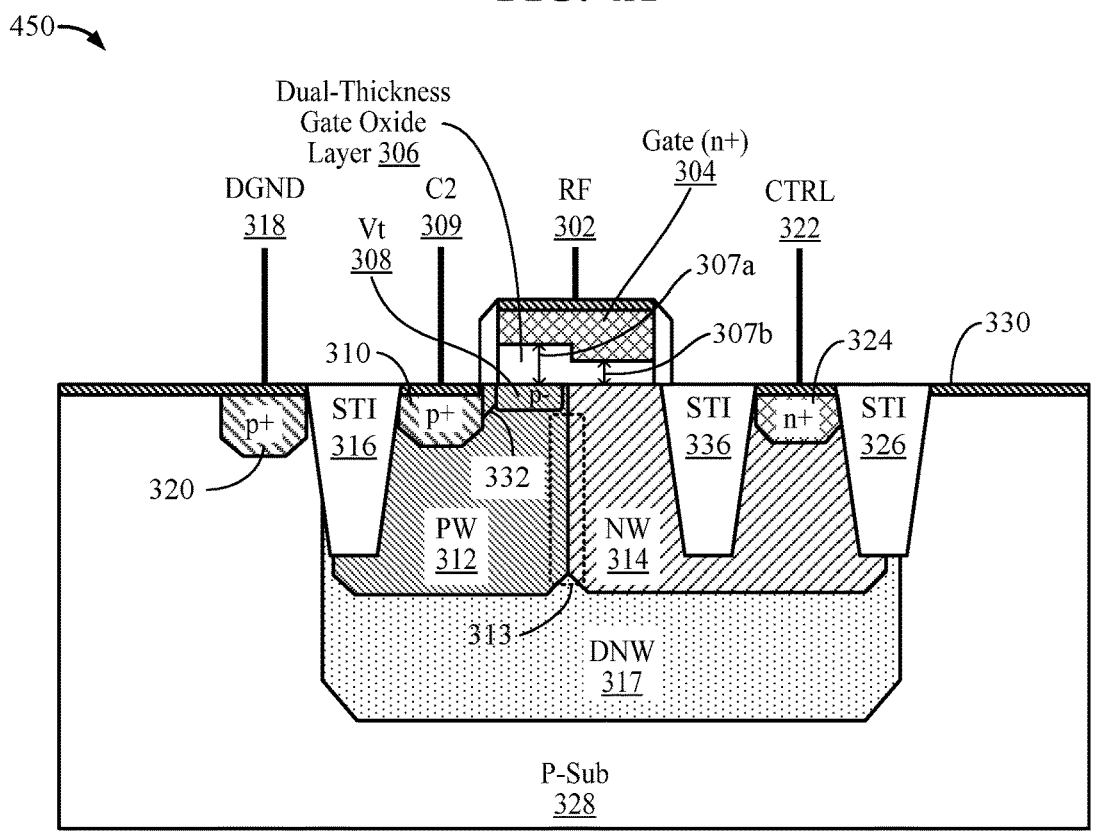
FIG. 4B depicts a cross-sectional view of an example n-gate transcap device with a variable thickness gate oxide layer in a first orientation and an additional STI region.

FIG. 4B depicts an n-gate transcap device 450 similar to transcap device 400 of FIG. 4A, but with an additional STI region 336.

Figure 5A:
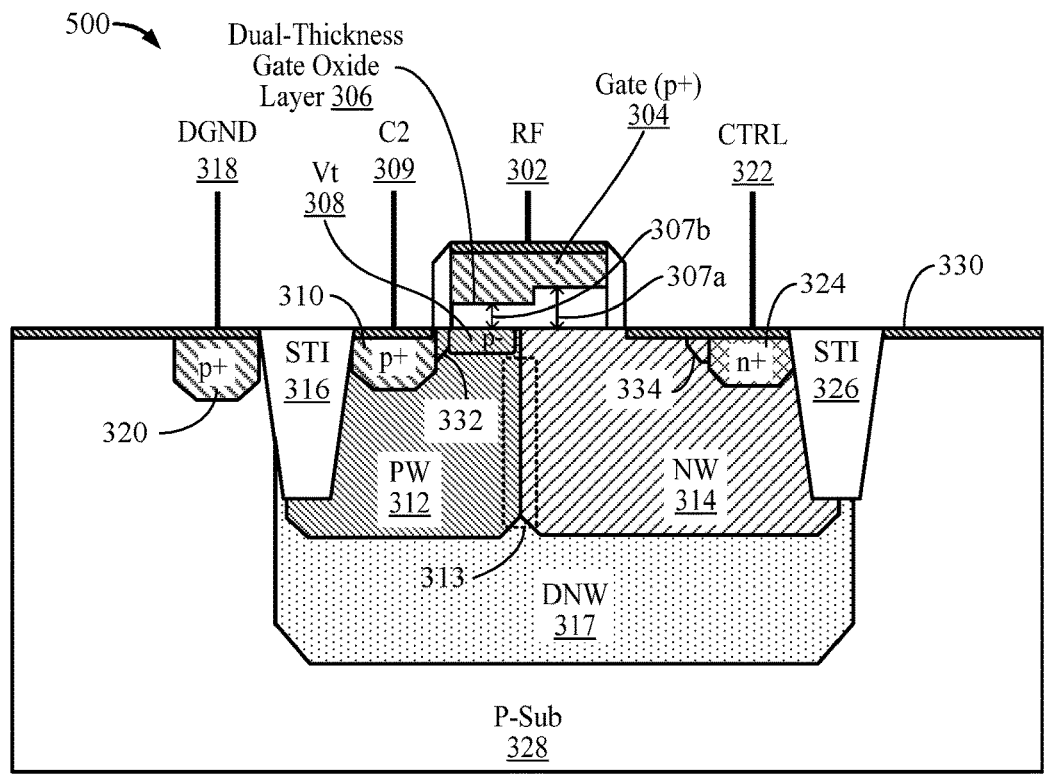
FIG. 5A depicts a cross-sectional view of an example p-gate transcap device with a variable thickness gate oxide layer in a second orientation.

FIG. 5A depicts a p-gate transcap device 500 similar to transcap device 300 in FIG. 3A, but in this example, the thick portion 307a of dual-thickness gate oxide layer 306 is on the control signal side (i.e., on the same side as control signal terminal 322).

Figure 5B:
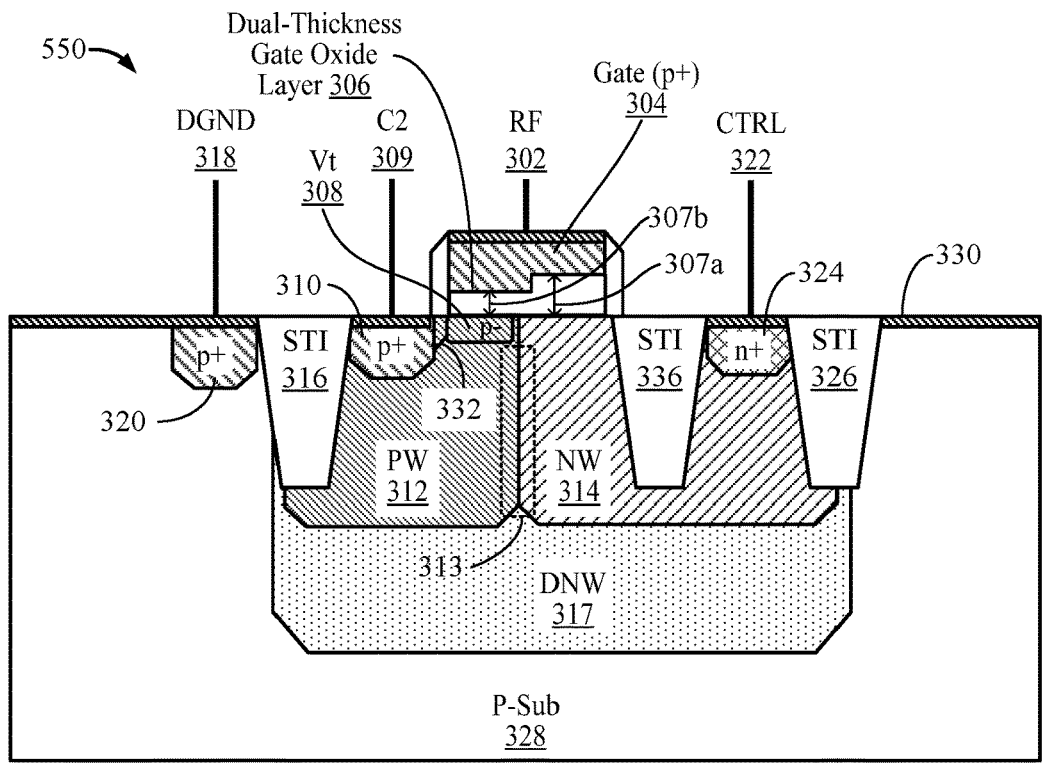
FIG. 5B depicts a cross-sectional view of an example p-gate transcap device with a variable thickness gate oxide layer in a second orientation and an additional STI region.

FIG. 5B depicts a p-gate transcap device 550 similar to transcap device 500 in FIG. 5A, but with an additional STI region 336.

Figure 6A:
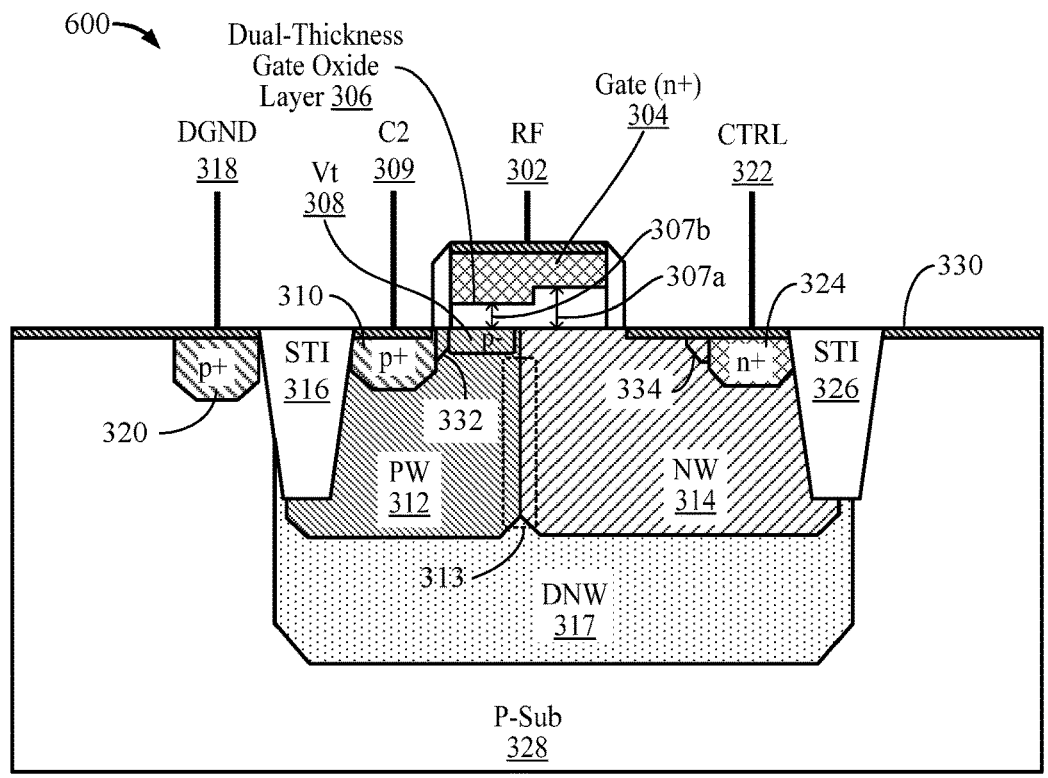
FIG. 6A depicts a cross-sectional view of an example n-gate transcap device with a variable thickness gate oxide layer in a second orientation.

FIG. 6A depicts an n-gate transcap device 600 similar to transcap device 500 in FIG. 5A, but in this example the non-insulative region 304 is n+ doped. In another embodiment, non-insulative region 304 may be an n-type metal gate.

Figure 6B:
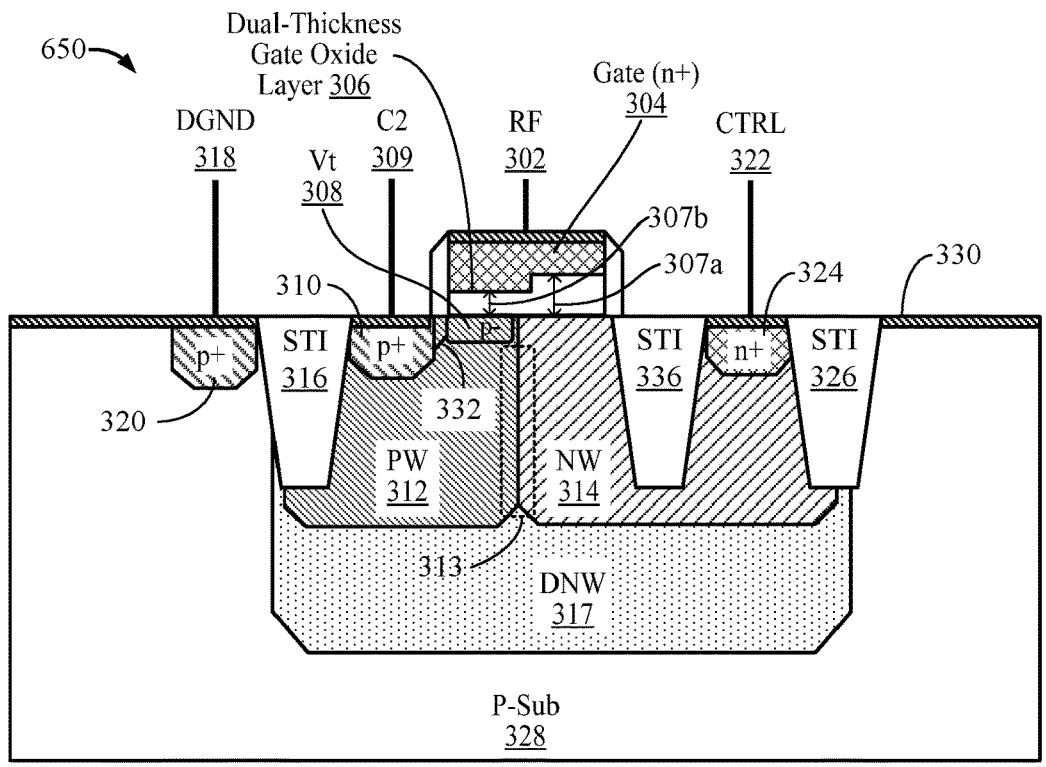
FIG. 6B depicts a cross-sectional view of an example n-gate transcap device with a variable thickness gate oxide layer in a second orientation and an additional STI region.

FIG. 6B depicts an n-gate transcap device 650 similar to transcap device 600 of FIG. 6A, but with an additional STI region 336.

Example Variable-Thickness Gate Oxide Layer Differential Transcap (TC) Devices

Figure 7A:
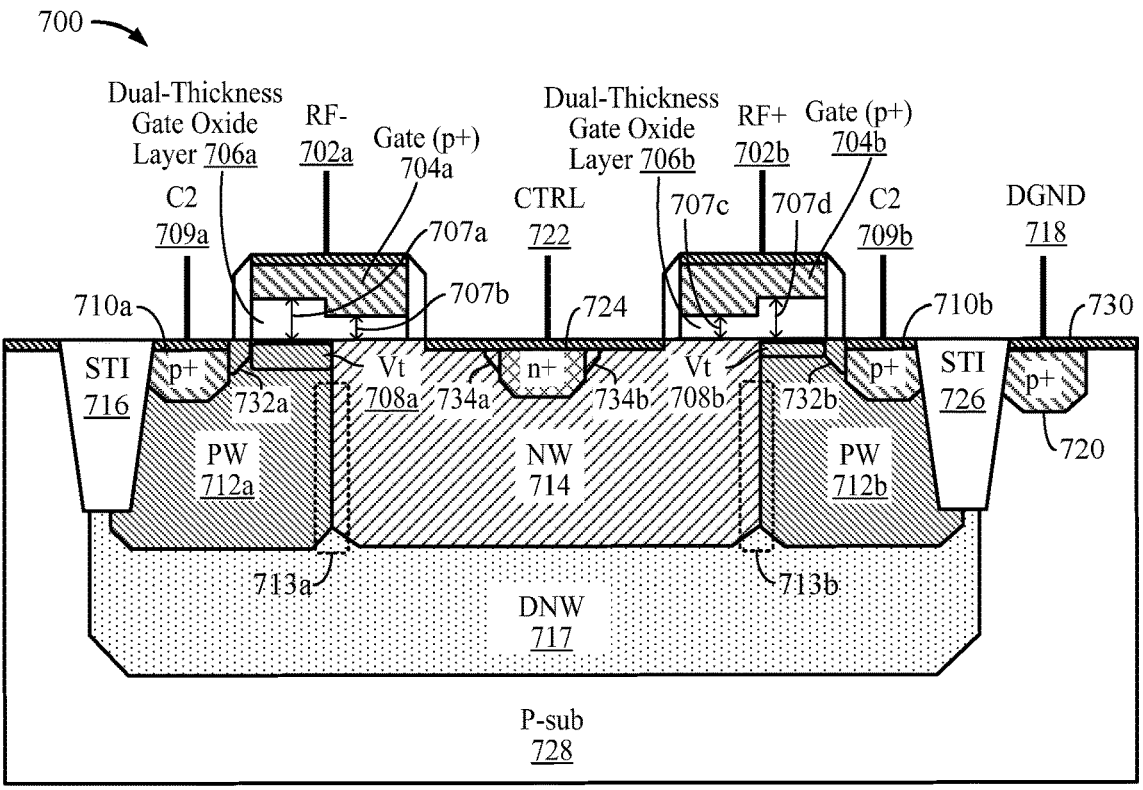
FIG. 7A depicts a cross-sectional view of an example p-gate differential transcap device with variable thickness gate oxide layers in a first orientation.

FIG. 7A depicts a cross-sectional view of an example p-gate differential transcap (DTC) device 700 with variable thickness gate oxide layers 706a and 706b. In this example, the variable thickness gate oxide layers 706a and 706b are dual-thickness gate oxide layers (i.e., having two distinct thicknesses per gate oxide layer). In this example, the second gate oxide layer 706b may be described as comprising a third layer portion with a third thickness 707c and a fourth layer portion with a fourth thickness 707d in order to distinguish the layer portions and associated thicknesses of the first gate oxide layer 706a. In some embodiments, the thick portions of gate oxide layers 706a and 706b (i.e., 707a and 707d) as well as the thin portions of gate oxide layers 706a and 706b (i.e., 707b and 707c) may be the same (or approximately the same) thickness. In other embodiments, the thin and thick portions of each gate oxide layer may be different for further tenability of DTC device 700.

In other examples, the variable thickness gate oxide layers 706a and 706b may include more than two distinct thicknesses. Notably, the location of the transition between first thickness 707a and second thickness 707b (or between 707c and 707d) in FIG. 7A is exemplary, and may be different in other examples. Further, in this example, the thin portions 707b and 707c of dual-thickness gate oxide layers 706a and 706b are on the control signal side (i.e., on the same side as control signal terminal 722). In some examples, the variable-thickness gate oxide layers 706a and 706b may formed in silicon on insulator (SOI) fabrication processes (e.g., CMOS fully depleted (FDSOI) or partial depleted SOI processes).

Non-insulative regions 704a and 704b (e.g., gates, analogous to the non-insulative regions 218 and 220 of FIG. 2) may be disposed above the dual-thickness gate oxide layers 706a and 706b. Note that as compared to oxide layers 202 and 204 of FIG. 2, dual-thickness gate oxide layers 706a and 706b include two distinct thicknesses, 707a and 707b, and 707c and 707d, respectively. Although non-insulative region 704 is doped p+ in FIG. 7A, non-insulative regions 704a and 704b may be alternatively doped, with, for example, p-type metal, n+ doping, n-type metal, and others in alternative embodiments. Using p+ or n+ doping or n-type metal or p-type metal for the non-insulative regions 704a and 704b in p-type or n-type channel DTC devices may beneficially reduce gate depletion. Non-insulative regions 704a and 704b are coupled to signal terminals 702a and 702b labeled "RF−" and "RF+", respectively in FIG. 7A.

In FIG. 7A, non-insulative regions 710a and 710b are disposed within and thus electrically coupled to p-wells (PWs) 712a and 712b, respectively. In this example, non-insulative regions 710a and 710b are doped p+, and PWs 712a and 712b are doped p− to connect each other. Although non-insulative regions 710a and 710b are doped p+ in this example, non-insulative regions 710a and 710b may be alternatively doped (e.g., n+) in other examples. Non-insulative regions 710a and 710b are coupled signal terminals 709a and 709b, respectively, each labeled "C2".

Non-insulative control region 724 is disposed within and thus electrically coupled to n-well (NW) 714. In this example, non-insulative control region 724 is doped n+, and NW 714 is doped n− to connect each other. Although non-insulative control region 724 is doped n+ in FIG. 7A, non-insulative control region 724 may be alternatively doped (e.g., p+) in other examples. Control region 724 is coupled to a control terminal 722 labeled "CTRL". In examples such as that of FIG. 7A, the non-insulative control region 724 has a different doping type than non-insulative regions 710a and 710b.

In this example, DTC device 700 includes threshold voltage (Vt) implant regions 708a and 708b interposed between non-insulative region 704a and 704b, respectively, (and more specifically, dual-thickness gate oxide layers 706a and 706b) and p-wells (PWs) 712a and 712b. Vt implant regions 708a and 708b may improve the quality factor (Q) of the capacitor formed between non-insulative region 704a and 704b and non-insulative regions 710a and 710b, respectively. Vt implant regions 708a and 708b may also decrease resistance in the pathway between RF− signal terminal 702a and C2 signal terminal 709a, as well as RF+ signal terminal 702b and C2 signal terminal 709b. Although Vt implant regions 708a and 708b are doped p− in FIG. 7A, Vt implant regions 708a and 708b may be alternatively doped (e.g., n−) in other examples. In some examples, Vt implant regions 708a and 708b may have the same doping type as non-insulative regions 710a and 710b (e.g., both p-doped as illustrated in FIG. 7A). In other examples, Vt implant regions 708a and 708b may be doped with any of various suitable dopants or implants (e.g., B or BF2).

In FIG. 7A, a semiconductor region 717 (here, a deep n-well (DNW) region) is disposed beneath semiconductor regions 712a, 712b, 714a, and 714b for noise isolation (e.g., isolating substrate 728 from noise from RF− and RF+ signal terminal 702a and 702b, respectively).

A substrate layer 728 (e.g., a p-type substrate labeled "P-sub") may be disposed below the semiconductor region (DNW) 717. In some examples, the substrate layer 728 may have a different doping type than the semiconductor (DNW) region 717. In this example, substrate layer 728 is coupled to a reference potential terminal (e.g., digital ground, labeled "DGND") via a non-insulative region 720.

In some examples, a first shallow trench isolation (STI) region 716 may be disposed between substrate layer 728 and semiconductor region (PW) 712a. In some examples, STI region 716 may also be disposed above at least a portion of semiconductor region (PW) 712a.

In some examples, a second STI region 726 may be disposed between substrate layer 728 and semiconductor region (NW) 714. In some examples, STI region 726 may also be disposed above at least a portion of semiconductor region (NW) 714. DTC device 700 also includes lightly doped diffusion (LDD) regions 732a, 732b, 734a, and 734b. For example, p-type LDD regions 732a and 732b may reduce series resistance between 710a or 710b with 708a or 708b. DTC device 700 also includes a silicide layer 730, which may beneficially reduce series resistance.

In operation, a control voltage applied between CTRL terminal 722 and C2 terminals 709a and 709b may be used to adjust the capacitance between the non-insulative regions 704a and 704b and the non-insulative regions 710a and 710b, respectively, across the dual-thickness gate oxide layers 706a and 702b, respectively. For example, varying the control voltage applied to CTRL terminal 722 varies the relative location (e.g., left and right) and size (e.g., width) of depletion regions 713a and 713b formed at the p-n junction between PW 712a and NW 714a as well as between PW 712b and NW 714b. As depletion regions 713a and 713b widen, the capacitance value of DTC device 700 is reduced due to the reduced area of the equivalent electrode formed by PWs 712a and 712b and Vts 708a and 708b. Further, as depletion regions 713a and 713b move, for example, away from the center (i.e., left for depletion region 713a and right for depletion region 713b), relatively less of the thicker portions 707a and 707d of dual thickness gate oxide layers 706a and 706b are engaged, which allows a further level of tuning of DTC device 700. For example, if more of the thicker portions 707a and 707d are engaged, the capacitance will be smaller, while if more of the thinner portions 707b and 707c are engaged, then the capacitance will be larger.

Figure 7B:
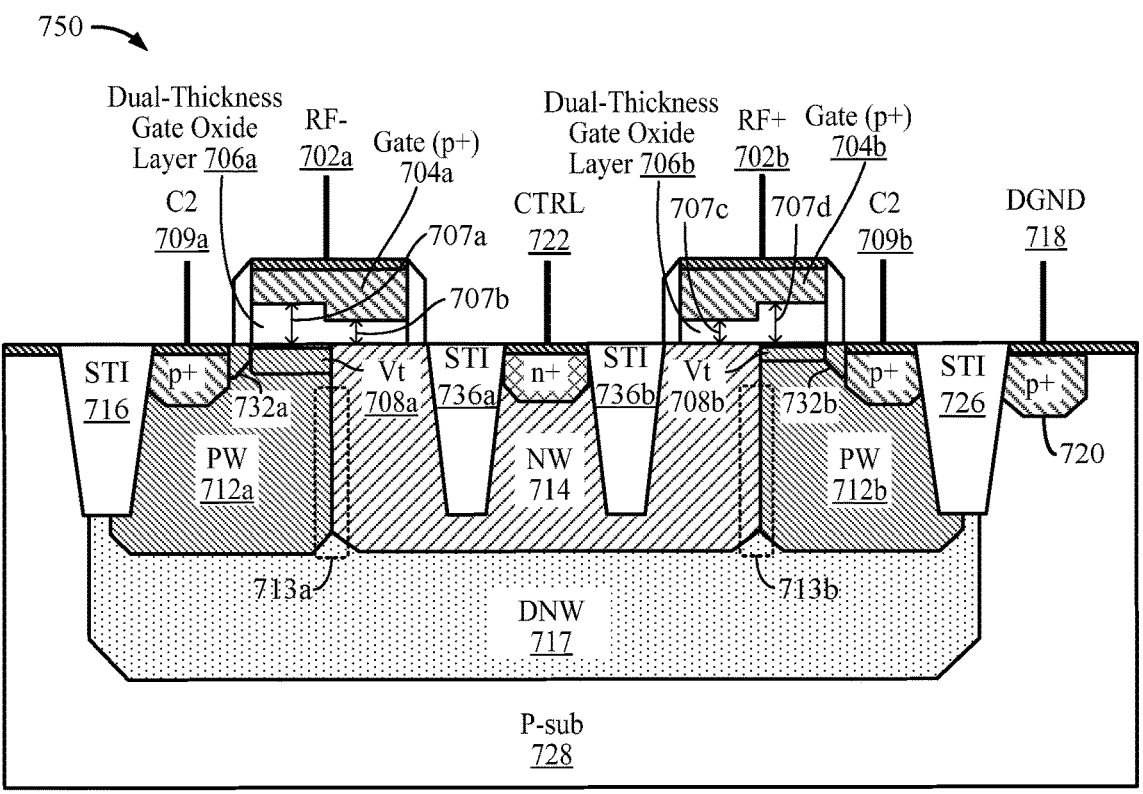
FIG. 7B depicts a cross-sectional view of an example p-gate differential transcap device with variable thickness gate oxide layers in a first orientation and additional STI regions.

FIG. 7B depicts a p-gate differential transcap device 750 similar to p-gate differential transcap device 700 in FIG. 7A, but with additional STI regions 736a and 736b. As above, the additional STI regions 736a and 736b allow a higher reverse bias voltage to be applied to control terminal 722 without breakdown.

Figure 8A:
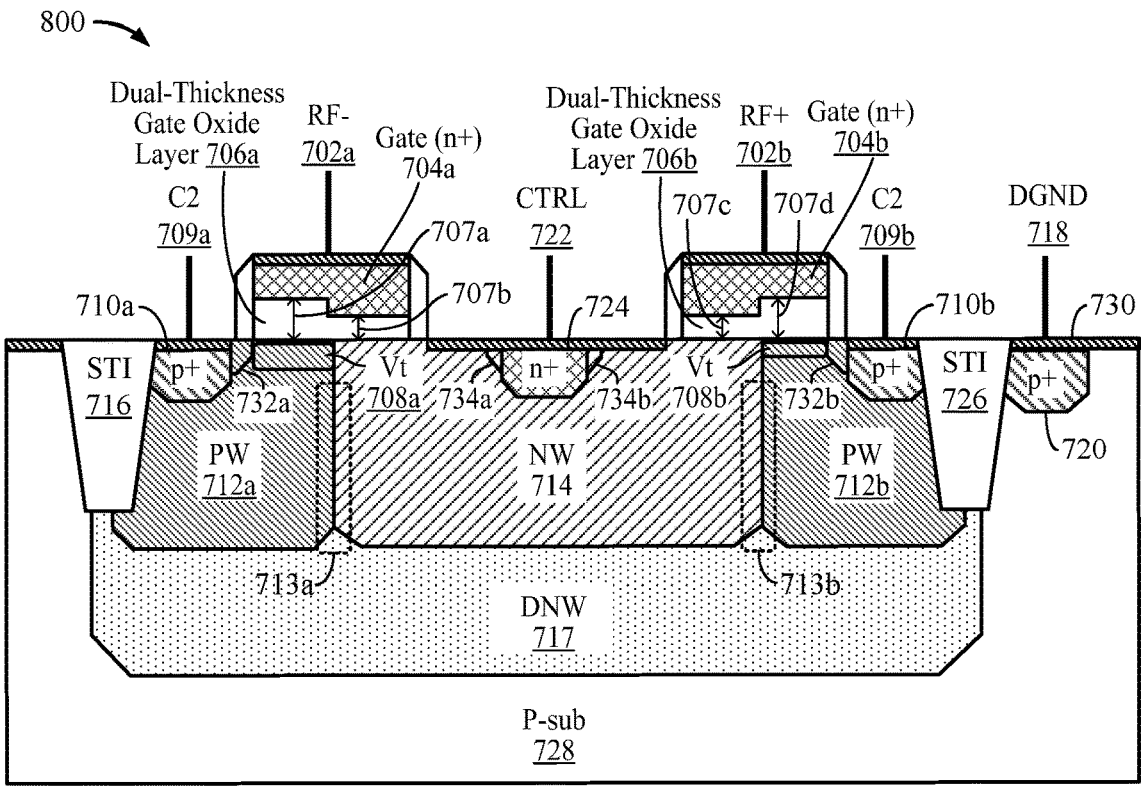
FIG. 8A depicts a cross-sectional view of an example n-gate differential transcap device with variable thickness gate oxide layers in a first orientation.

FIG. 8A depicts an n-gate differential transcap device 800 similar to n-gate differential transcap device 700 in FIG. 7A, but in this example non-insulative regions 704a and 704b are n+ doped. In other embodiments, non-insulative regions 704a and 704b may be an n-type metal.

Figure 8B:
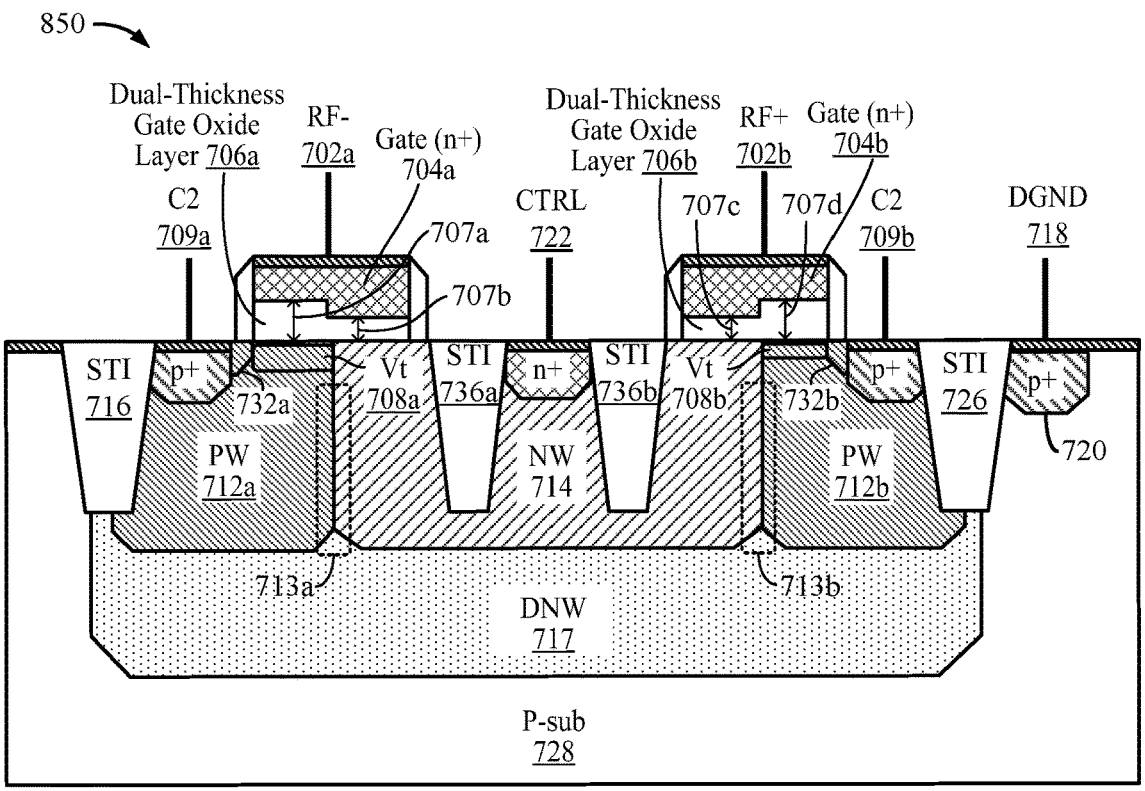
FIG. 8B depicts a cross-sectional view of an example n-gate differential transcap device with variable thickness gate oxide layers in a first orientation and additional STI regions.

FIG. 8B depicts an n-gate differential transcap device 450 similar to n-gate differential transcap device 800 of FIG. 8A, but with additional STI regions 736a and 736b.

Figure 9A:
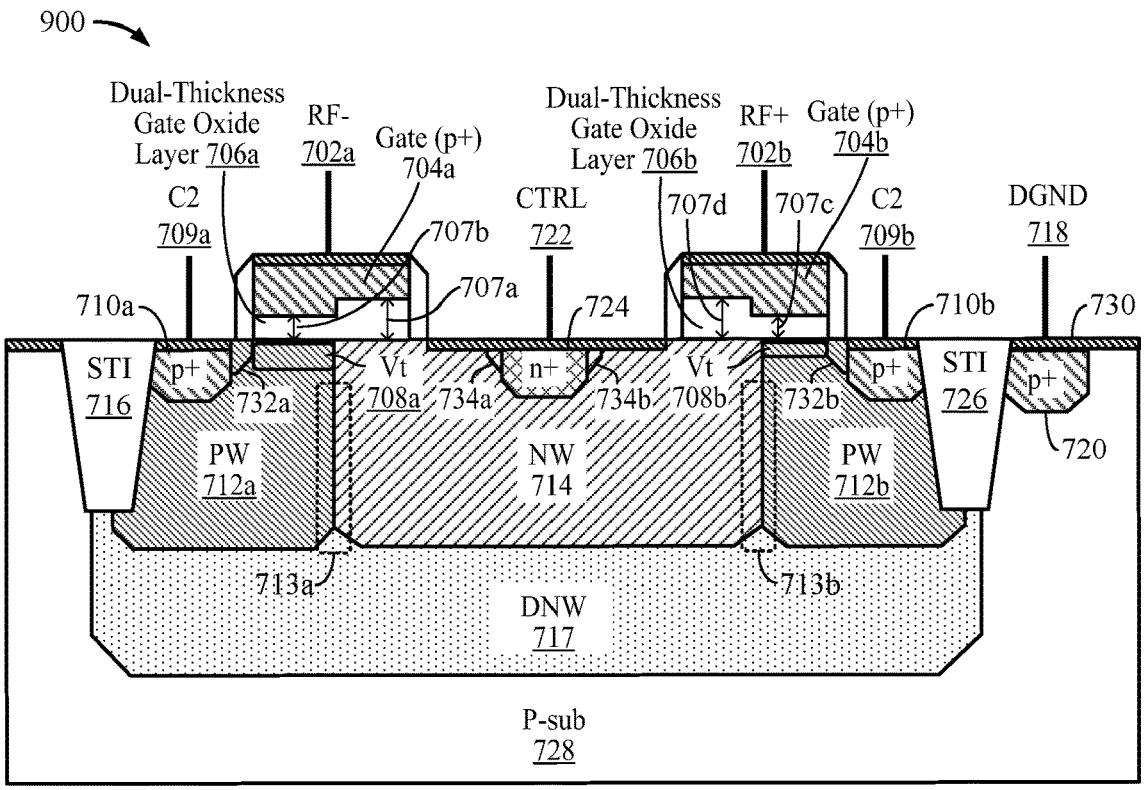
FIG. 9A depicts a cross-sectional view of an example p-gate differential transcap device with variable thickness gate oxide layers in a second orientation.

FIG. 9A depicts a p-gate differential transcap device 900 similar to p-gate differential transcap device 700 in FIG. 7A, but in this example, the thick portions 707a and 707b of dual-thickness gate oxide layers 706a and 706b are facing inward toward the control signal terminal 722, which is disposed between the two non-insulative regions 704a and 704b.

Figure 9B:
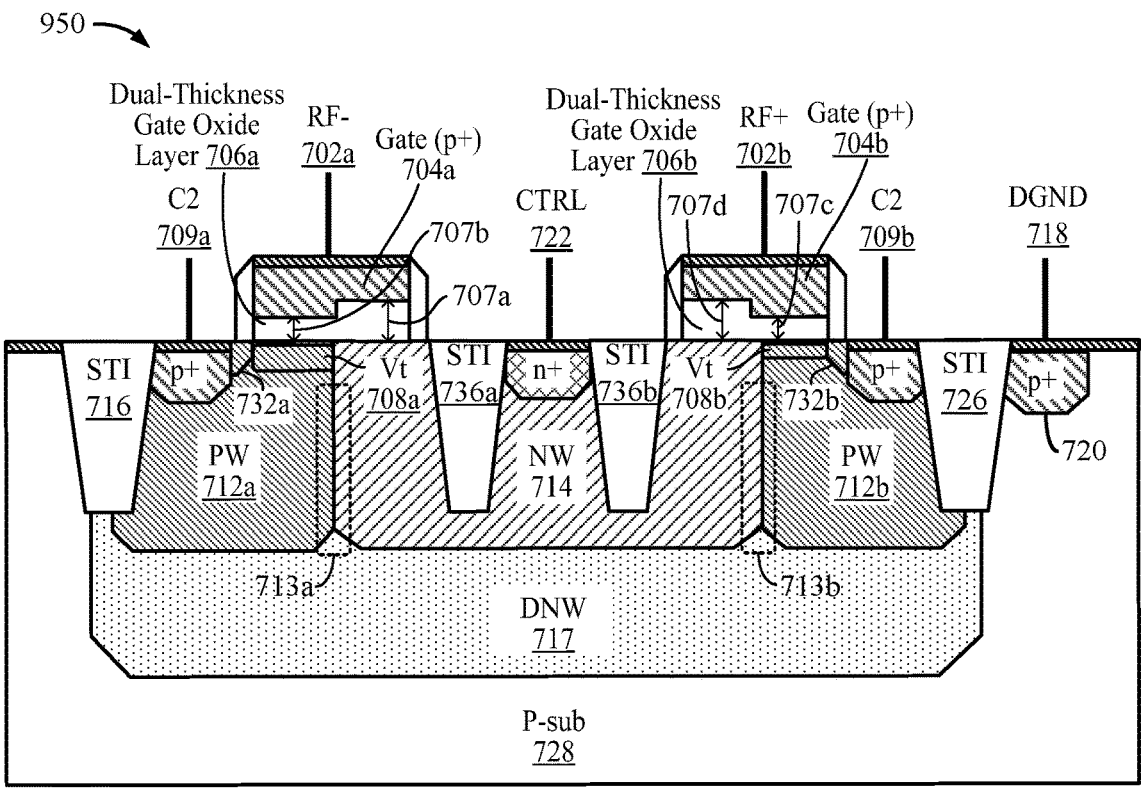
FIG. 9B depicts a cross-sectional view of an example p-gate differential transcap device with variable thickness gate oxide layers in a second orientation and additional STI regions.

FIG. 9B depicts a p-gate differential transcap device 950 similar to p-gate differential transcap device 900 in FIG. 9A, but with an additional STI regions 736a and 736b.

Figure 10A:
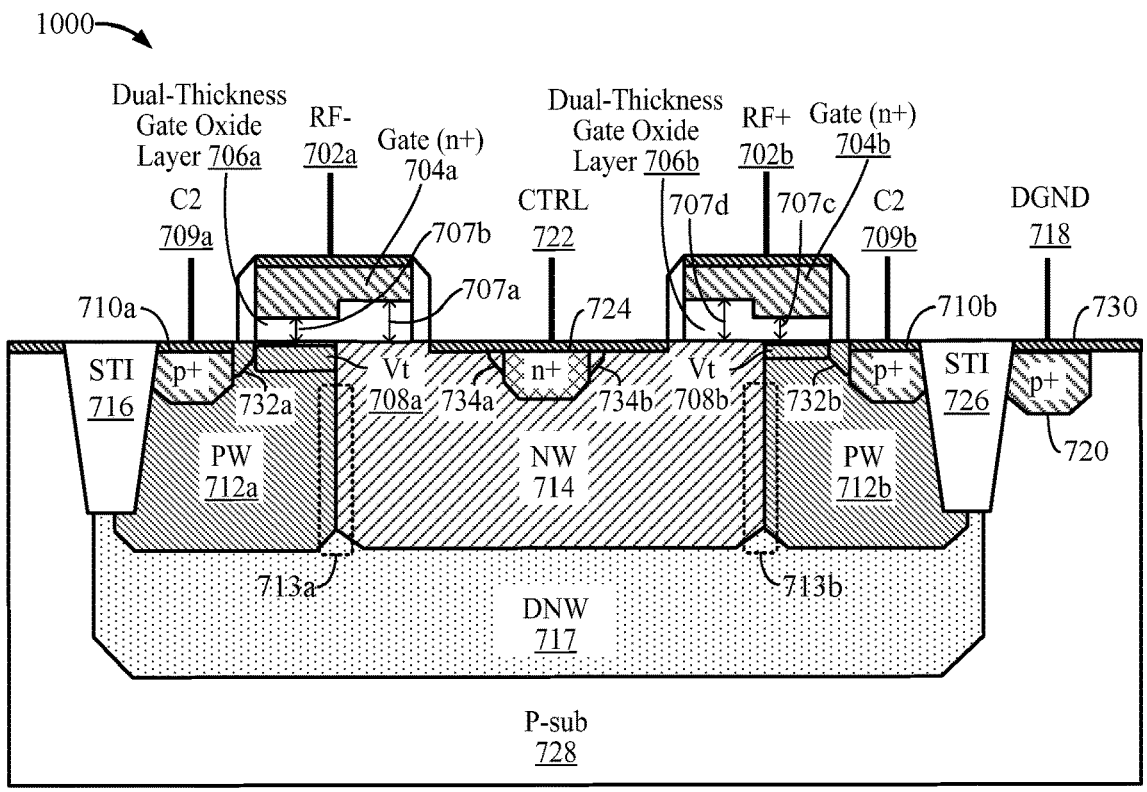
FIG. 10A depicts a cross-sectional view of an example n-gate differential transcap device with variable thickness gate oxide layers in a second orientation.

FIG. 10A depicts an n-gate differential transcap device 600 similar to differential transcap device 900 in FIG. 9A, but in this example the non-insulative regions 704a and 704b are n+ doped. In other embodiments, non-insulative regions 704a and 704b may be an n-type metal.

Figure 10B:
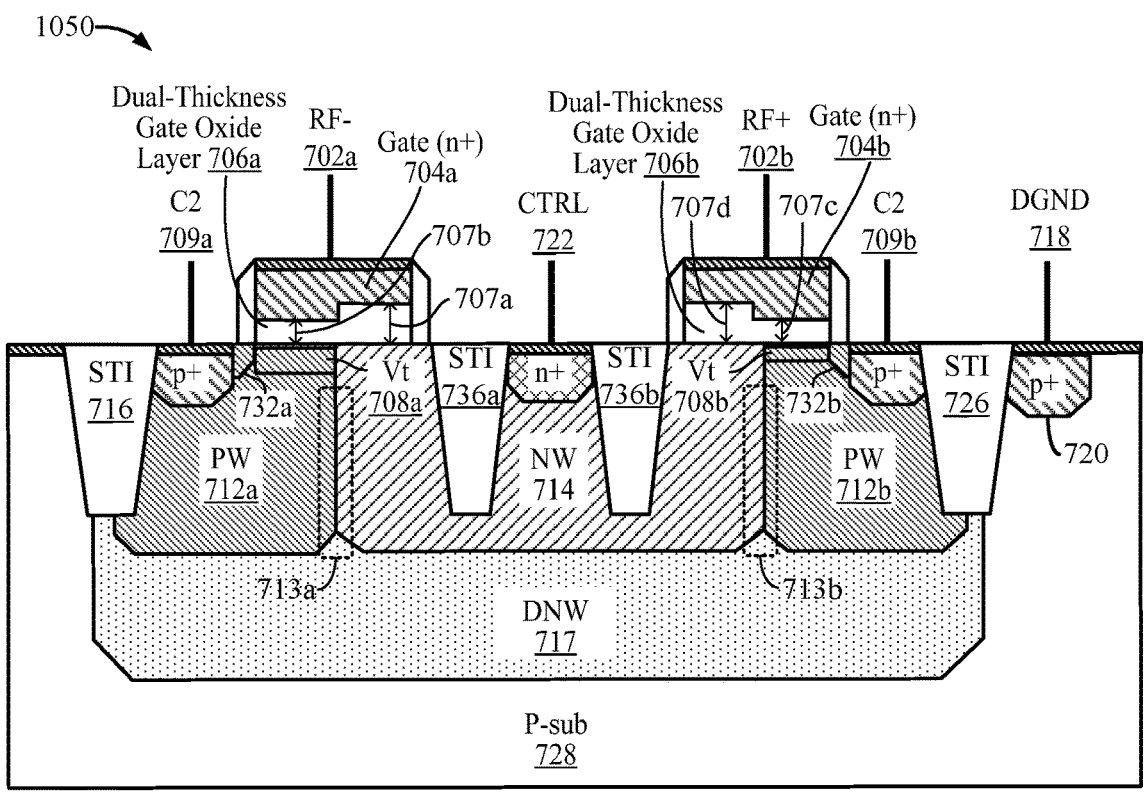
FIG. 10B depicts a cross-sectional view of an example n-gate differential transcap device with variable thickness gate oxide layers in a second orientation and additional STI regions.

FIG. 10B depicts an n-gate differential transcap device 1050 similar to transcap device 1000 of FIG. 10A, but with an additional STI regions 736a and 736b.

Example Method for Fabricating a Transcap Device

Figure 11:
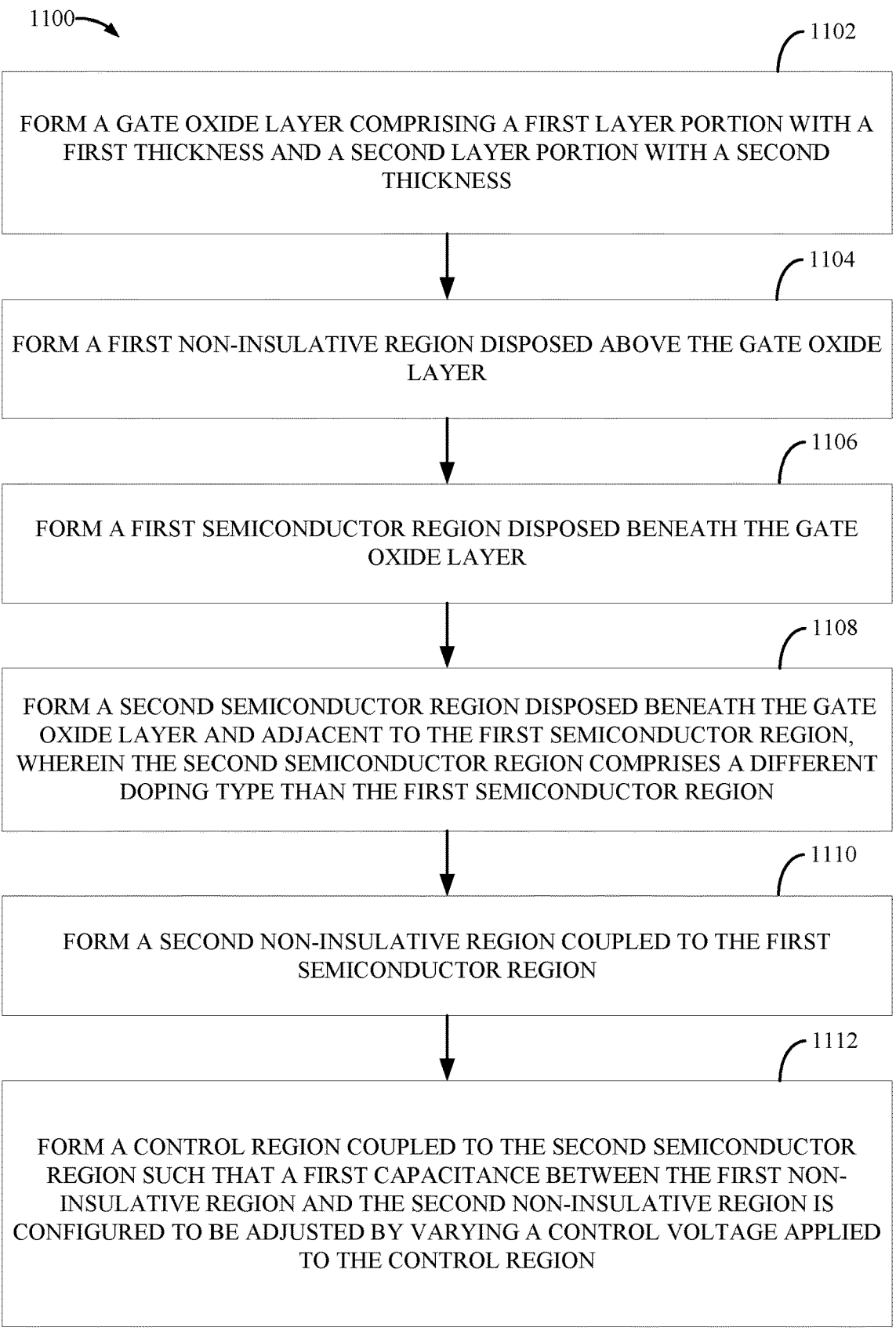
FIG. 11 depicts a method for fabricating a transcap device.

FIG. 11 depicts a method 1100 for fabricating a transcap device (e.g., the transcap devices depicted in FIGS. 3A-10B), in accordance with certain aspects of the present disclosure. The operations 1500 may be performed by an apparatus, such as a semiconductor processing chamber.

The method 1100 beings at step 1102 with forming a gate oxide layer comprising a first layer portion with a first thickness and a second layer portion with a second thickness. For example, a dual-thickness gate oxide layer like 306 in FIGS. 3A-6B or 706a and 706b in FIGS. 7A-10B may be formed.

The method 1100 then proceeds to step 1104 where a first non-insulative region disposed above the gate oxide layer is formed. For example, non-insulative regions 304 in FIGS. 3A-6B or 704a and 704b in FIGS. 7A-10B may be formed.

The method 1100 then proceeds to step 1106 where a first semiconductor region disposed beneath the gate oxide layer is formed. For example, non-insulative regions 312 in FIGS. 3A-6B or 712a and 712b in FIGS. 7A-10B may be formed.

The method 1100 then proceeds to step 1108 where a second semiconductor region disposed beneath the gate oxide layer and adjacent to the first semiconductor region is formed, wherein the second semiconductor region comprises a different doping type than the first semiconductor region. For example, non-insulative regions 314 in FIGS. 3A-6B or 714a and 714b in FIGS. 7A-10B may be formed.

The method 1100 then proceeds to step 1110 where a second non-insulative region coupled to the first semiconductor region is formed. For example, non-insulative regions 310 in FIGS. 3A-6B or 710a and 710b in FIGS. 7A-10B may be formed. In some embodiments, the first non-insulative region comprises the same doping type as the second non-insulative region. In some embodiments, the second non-insulative region and the control region have different doping types.

The method 1100 then proceeds to step 1112 where a control region coupled to the second semiconductor region is formed such that a first capacitance between the first non-insulative region and the second non-insulative region is configured to be adjusted by varying a control voltage applied to the control region. For example, control regions 324 in FIGS. 3A-6B or 724 in FIGS. 7A-10B may be formed.

Though not shown in FIG. 11, the method 1100 may include additional steps. For example, method 1100 may also include forming a threshold voltage (Vt) implant region interposed between the gate oxide layer and the second non-insulative layer, wherein the Vt implant region comprises the same doping type as the second non-insulative region. For example, Vt implants 308 in FIGS. 3A-6B or 708a and 708b in FIGS. 7A-10B may be formed. In some embodiments, the Vt implant region instead comprises the same doping type as the first non-insulative region. In some embodiments, the Vt implant region comprises a different doping type than the first non-insulative region.

Method 1100 may also include forming a third semiconductor region disposed beneath the first and second semiconductor regions. For example, deep n-well (DNW) 317 in FIGS. 3A-6B or 717 in FIGS. 7A-10B may be formed. In some embodiments, the third semiconductor region comprises a different doping type than the first semiconductor region.

Method 1100 may also include forming a substrate layer disposed below the third semiconductor region, wherein the substrate layer comprises a different doping type than the third semiconductor region and wherein the substrate layer is coupled to a reference potential terminal. For example, substrate 328 in FIGS. 3A-6B or 728 in FIGS. 7A-10B may be formed.

Method 1100 may also include forming a first shallow trench isolation (STI) region disposed above at least a portion of the first semiconductor region and a second STI region disposed above at least a portion of the second semiconductor region. For example, STIs 316 and 326 in FIGS. 3A-6B or 716 and 726 in FIGS. 7A-10B may be formed. In some embodiments, the second semiconductor region is electrically coupled to the control region (as in FIGS. 3A-6B).

Method 1100 may also include forming a third shallow trench isolation (STI) region disposed within the second semiconductor region and adjacent to the control region. For example, STIs 336 in FIGS. 3A-6B or 736a and 736b in FIGS. 7A-10B may be formed.

Aspects of the present disclosure provide several advantages. For example, aspects of the present disclosure offer transcap devices with at a gate oxide layer comprising at least two portions with distinct thicknesses. The fabrication processes for these transcap devices may include CMOS-compatible silicon on insulator (SOI) processes, which may be low cost. By having variable thickness gate oxide layers, such transcaps may provide greater capacitance resolution.

Furthermore, using n-doped or p-doped Vt implant regions may reduce n-type or p-type channel accumulation mode surface resistance and may increase the Q of the transcap devices. Moreover, using a deep n-well (DNW) may isolate RF noise from the substrate layer (e.g., P-sub).

Certain aspects of the present disclosure also use n+ or p+ doping or p-type metal or n-type metal for n or p channel transcap devices, which may reduce the gate depletion therein. Certain aspects of the present disclosure also provide transcap devices that can be scaled with high-k/metal gate (HK/MG) and fin field-effect transistor (finFET) technologies.

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A semiconductor variable capacitor comprising:
   a gate oxide layer comprising a first layer portion with a first thickness and a second layer portion with a second thickness;
   a first non-insulative region disposed above the gate oxide layer;
   a first semiconductor region disposed beneath the gate oxide layer;
   a second semiconductor region disposed beneath the gate oxide layer and adjacent to the first semiconductor region, wherein the second semiconductor region comprises a different doping type than the first semiconductor region;
   a second non-insulative region coupled to the first semiconductor region; and
   a control region coupled to the second semiconductor region such that a first capacitance between the first non-insulative region and the second non-insulative region is configured to be adjusted by varying a control voltage applied to the control region,
   wherein the second non-insulative region and the control region have different doping types.

2. The semiconductor variable capacitor of claim 1, further comprising a threshold voltage (Vt) implant region interposed between the gate oxide layer and the second non-insulative region, wherein the Vt implant region comprises the same doping type as the second non-insulative region.

3. The semiconductor variable capacitor of claim 2, wherein the Vt implant region comprises the same doping type as the first non-insulative region.

4. The semiconductor variable capacitor of claim 2, wherein the Vt implant region comprises a different doping type than the first non-insulative region.

5. The semiconductor variable capacitor of claim 3, wherein the first non-insulative region comprises the same doping type as the second non-insulative region.

6. The semiconductor variable capacitor of claim 1, further comprising a third semiconductor region disposed beneath the first and second semiconductor regions.

7. The semiconductor variable capacitor of claim 6, wherein the third semiconductor region comprises a different doping type than the first semiconductor region.

8. The semiconductor variable capacitor of claim 6, further comprising a substrate layer disposed below the third semiconductor region, wherein the substrate layer comprises a different doping type than the third semiconductor region and wherein the substrate layer is coupled to a reference potential terminal.

9. The semiconductor variable capacitor of claim 1, further comprising: a first shallow trench isolation (STI) region disposed above at least a portion of the first semiconductor region.

10. The semiconductor variable capacitor of claim 9, further comprising: a second STI region disposed above at least a portion of the second semiconductor region wherein the second semiconductor region is electrically coupled to the control region.

11. The semiconductor variable capacitor of claim 10, further comprising: a third STI region disposed within the second semiconductor region and located between the control region and the gate oxide layer.

12. The semiconductor variable capacitor of claim 1, wherein the first non-insulative region is p+ doped.

13. The semiconductor variable capacitor of claim 1, wherein the first non-insulative region is n+ doped.

14. The semiconductor variable capacitor of claim 12, wherein the first layer portion is closer to the control region that then second layer portion.

15. The semiconductor variable capacitor of claim 12, wherein the second layer portion is closer to the control region that then first layer portion.

16. The semiconductor variable capacitor of claim 13, wherein the first layer portion is closer to the control region that then second layer portion.

17. The semiconductor variable capacitor of claim 13, wherein the second layer portion is closer to the control region that then first layer portion.

18. A semiconductor variable capacitor comprising:
a gate oxide layer comprising a first layer portion with a first thickness and a second layer portion with a second thickness;
a first non-insulative region disposed above the gate oxide layer and connected to a first signal terminal, wherein the gate oxide layer is either p+ doped or n+ doped;
a first semiconductor region disposed beneath the gate oxide layer, wherein the first semiconductor region is p doped;
a second semiconductor region disposed beneath the gate oxide layer and adjacent to the first semiconductor region, wherein the second semiconductor region is n doped;
a third semiconductor region disposed beneath the first and second semiconductor regions and within a substrate, wherein the third semiconductor region is n doped;
a second non-insulative region disposed within the first semiconductor region and connected to a second signal terminal, wherein the second non-insulative region is p+ doped;
a third non-insulative region disposed within the substrate and connected to a ground terminal; and
a control region disposed within the second semiconductor region and connected to a control terminal, wherein a first capacitance between the first non-insulative region and the second non-insulative region is configured to be adjusted by varying a control voltage applied to the control region via the control terminal.

19. A semiconductor differential variable capacitor comprising:
a first gate oxide layer comprising a first layer portion with a first thickness and a second layer portion with a second thickness;
a second gate oxide layer comprising a third layer portion with a third thickness and a fourth layer portion with a fourth thickness;
a first non-insulative region disposed above the first gate oxide layer and connected to a first signal terminal, wherein the first gate oxide layer is either p+ doped or n+ doped;
a second non-insulative region disposed above the second gate oxide layer and connected to a second signal terminal, wherein the second gate oxide layer is either p+ doped or n+ doped;
a first semiconductor region disposed beneath the first gate oxide layer, wherein the first semiconductor region is p doped;
a second semiconductor region disposed beneath the second gate oxide layer, wherein the second semiconductor region is p doped;
a third semiconductor region disposed beneath the first gate oxide layer and the second gate oxide layer and between the first semiconductor region and the second semiconductor region, wherein the third semiconductor region is n doped;
a fourth semiconductor region disposed beneath the first, second, and third semiconductor regions and within a substrate, wherein the third semiconductor region is n doped;
a third non-insulative region disposed within the first semiconductor region and connected to a third signal terminal, wherein the third non-insulative region is p+ doped;
a fourth non-insulative region disposed within the second semiconductor region and connected to a fourth signal terminal, wherein the fourth non-insulative region is p+ doped;
a fifth non-insulative region disposed within the substrate and connected to a ground terminal; and
a control region disposed within the third semiconductor region and connected to a control terminal, wherein a first capacitance between the first non-insulative region and the third non-insulative region, as well as a second capacitance between the second non-insulative region and the fourth non-insulative region, is configured to be adjusted by varying a control voltage applied to the control region via the control terminal.

* * * * *